(12) United States Patent
Ueda et al.

(10) Patent No.: US 8,750,030 B2
(45) Date of Patent: Jun. 10, 2014

(54) MAGNETORESISTIVE ELEMENT AND MAGNETIC RANDOM ACCESS MEMORY

(75) Inventors: Koji Ueda, Kamakura (JP); Tadashi Kai, Tokyo (JP); Toshihiko Nagase, Yokohama (JP); Katsuya Nishiyama, Yokohama (JP); Eiji Kitagawa, Yokohama (JP); Tadaomi Daibou, Yokohama (JP); Makoto Nagamine, Tokyo (JP); Hiroaki Yoda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 367 days.

(21) Appl. No.: 13/236,589

(22) Filed: Sep. 19, 2011

(65) Prior Publication Data
US 2012/0069642 A1 Mar. 22, 2012

(30) Foreign Application Priority Data

Sep. 21, 2010 (JP) ................. 2010-211204

(51) Int. Cl.
*G11C 11/00* (2006.01)
(52) U.S. Cl.
USPC ........... 365/158; 365/148; 365/171; 977/933; 977/935
(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 216/22; 257/421, E21.665; 438/3; 428/810–816, 817–825.1, 826; 977/933–935
See application file for complete search history.

(56) References Cited

U.S. PATENT DOCUMENTS

2003/0007398 A1* 1/2003 Daughton et al. ............ 365/200
2004/0061154 A1* 4/2004 Huai et al. .................... 257/295

(Continued)

FOREIGN PATENT DOCUMENTS

JP 2007-142364 A 6/2007
JP 2008-211057 9/2008

(Continued)

OTHER PUBLICATIONS

S. Ikeda et al. "A Perpendicular-anisotropy CoFeb-MgO Magnetic Tunnel Junction," Nature Materials, Advanced Online Publications/, www.nature.com/naturematerials, Jul. 11, 2010; pp. 1-4.

(Continued)

*Primary Examiner* — Harry W Byrne
(74) *Attorney, Agent, or Firm* — Knobbe, Martens, Olson & Bear, LLP

(57) ABSTRACT

According to one embodiment, a magnetoresistive element includes an electrode layer, a first magnetic layer, a second magnetic layer and a nonmagnetic layer. The electrode layer includes a metal layer including at least one of Mo, Nb, and W. The first magnetic layer is disposed on the metal layer to be in contact with the metal layer and has a magnetization easy axis in a direction perpendicular to a film plane and is variable in magnetization direction. The second magnetic layer is disposed on the first magnetic layer and has a magnetization easy axis in the direction perpendicular to the film plane and is invariable in magnetization direction. The nonmagnetic layer is provided between the first and second magnetic layers. The magnetization direction of the first magnetic layer is varied by a current that runs through the first magnetic layer, the nonmagnetic layer, and the second magnetic layer.

9 Claims, 7 Drawing Sheets

(56) References Cited

U.S. PATENT DOCUMENTS

| | | | |
|---|---|---|---|
| 2005/0118458 A1* | 6/2005 | Slaughter et al. | 428/692 |
| 2005/0225900 A1* | 10/2005 | Itoh et al. | 360/135 |
| 2006/0018057 A1* | 1/2006 | Huai | 360/324.2 |
| 2007/0019337 A1* | 1/2007 | Apalkov et al. | 360/324.1 |
| 2007/0086121 A1 | 4/2007 | Nagase et al. | |
| 2007/0096229 A1* | 5/2007 | Yoshikawa et al. | 257/421 |
| 2007/0297220 A1* | 12/2007 | Yoshikawa et al. | 365/158 |
| 2008/0164547 A1* | 7/2008 | Higo et al. | 257/421 |
| 2008/0205126 A1 | 8/2008 | Kajiyama et al. | |
| 2008/0225583 A1* | 9/2008 | Guo et al. | 365/173 |
| 2008/0310214 A1* | 12/2008 | Wang et al. | 365/158 |
| 2009/0027810 A1* | 1/2009 | Horng et al. | 360/324.2 |
| 2009/0080238 A1 | 3/2009 | Yoshikawa et al. | |
| 2009/0243008 A1 | 10/2009 | Kitagawa et al. | |
| 2010/0080050 A1* | 4/2010 | Ozeki et al. | 365/158 |
| 2010/0118600 A1 | 5/2010 | Nagase et al. | |
| 2010/0230770 A1 | 9/2010 | Yoshikawa et al. | |
| 2011/0049659 A1 | 3/2011 | Suzuki et al. | |

FOREIGN PATENT DOCUMENTS

| | | |
|---|---|---|
| JP | 2009-239120 | 10/2009 |
| WO | WO 2009/133650 | 11/2009 |

OTHER PUBLICATIONS

U.S. Appl. No. 13/543,112, filed Jul. 6, 2012, Ebata.

Japanese Office Action dated Sep. 11, 2012 for Japanese Application No. 2010-211204 filed on Sep. 21, 2010.

* cited by examiner

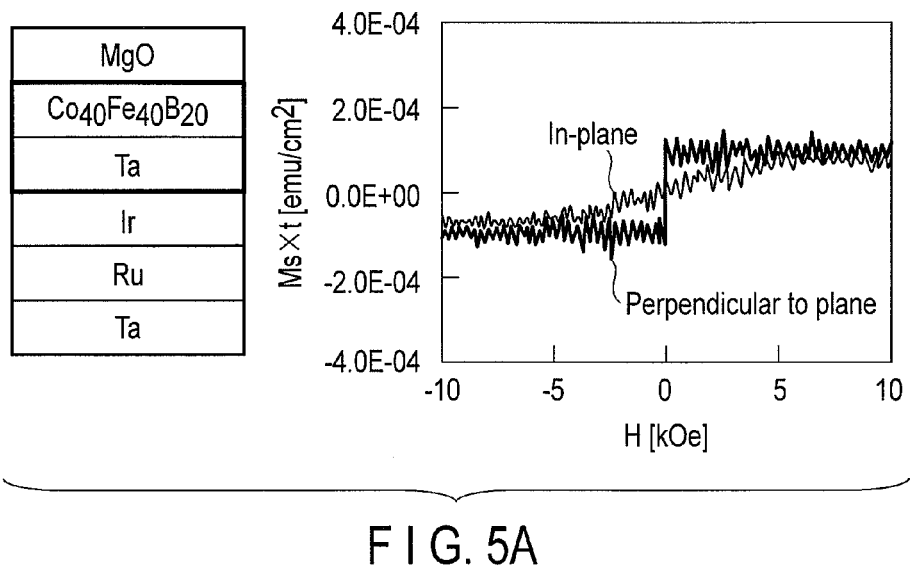
F I G. 5A
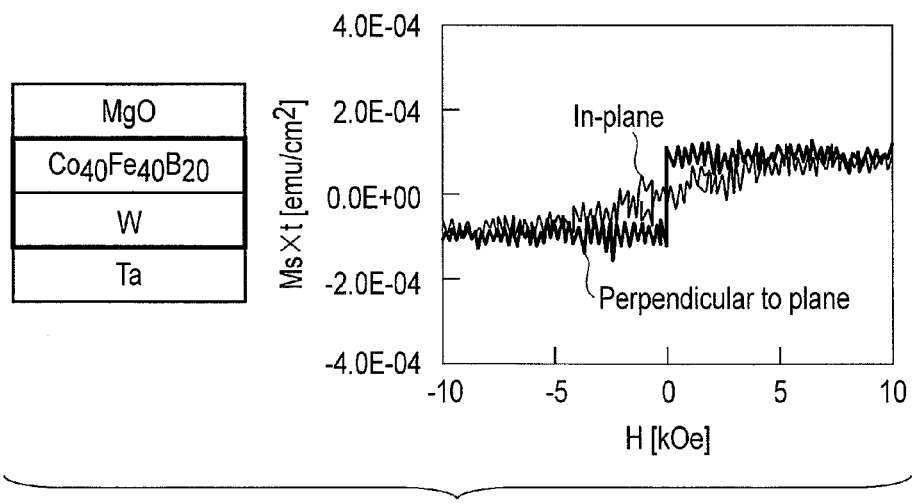
F I G. 5B

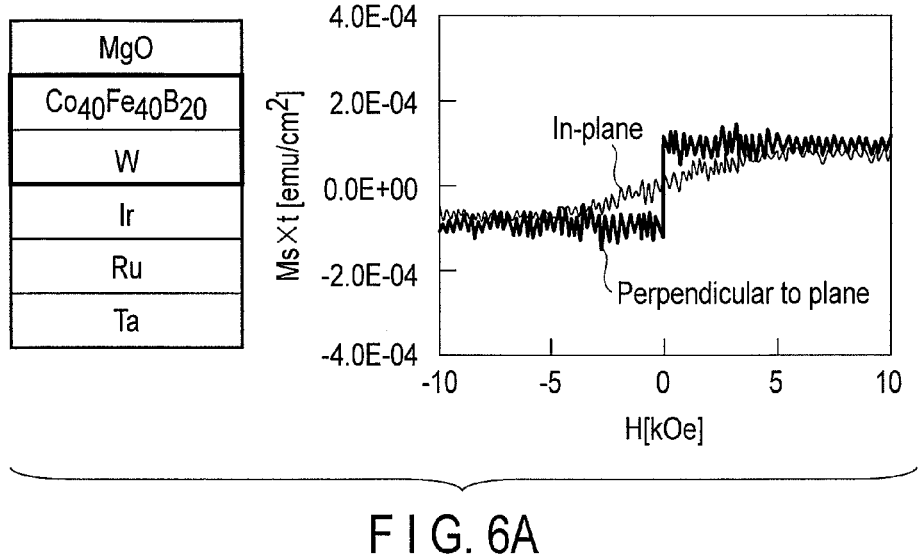
F I G. 6A
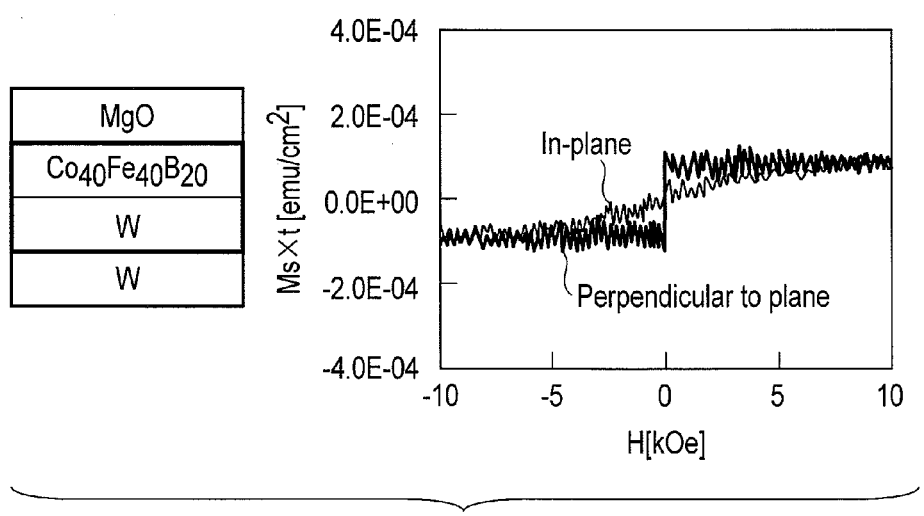
F I G. 6B

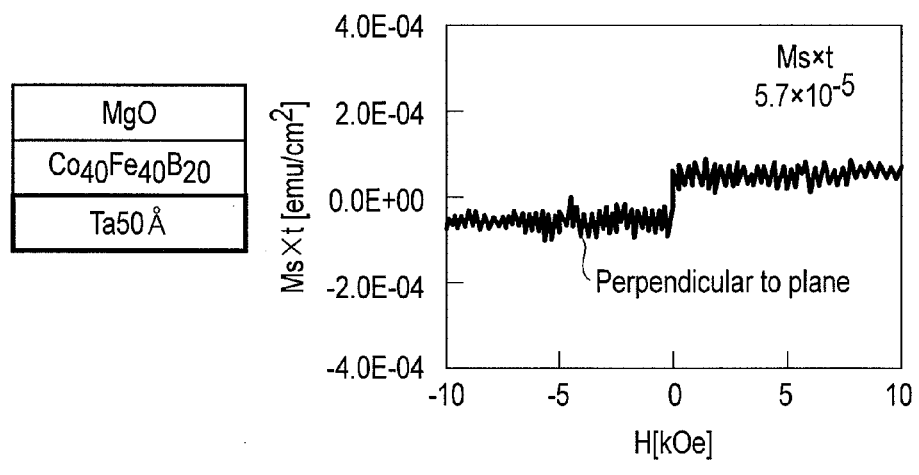
F I G. 7A
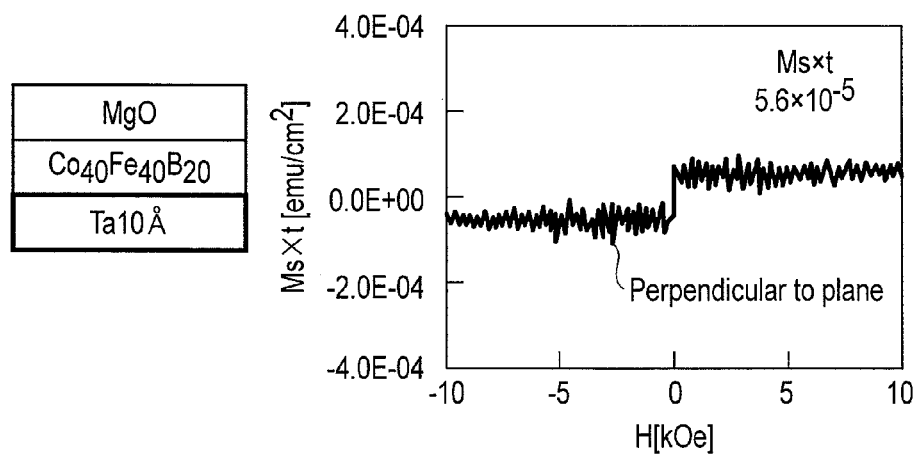
F I G. 7B

MAGNETORESISTIVE ELEMENT AND MAGNETIC RANDOM ACCESS MEMORY

CROSS-REFERENCE TO RELATED APPLICATIONS

This application is based upon and claims the benefit of priority from prior Japanese Patent Application No. 2010-211204, filed Sep. 21, 2010, the entire contents of which are incorporated herein by reference.

FIELD

Embodiments described herein relate generally to a magnetoresistive element and a magnetic random access memory.

BACKGROUND

Recently, as next-generation solid-state nonvolatile memories capable of high-speed reading/writing, high capacity, and low-power-operation, magnetic random access memories (MRAM) that use the magnetoresistive effect of a ferromagnetic body have been drawing increasing attention. In particular, a spin-transfer torque writing type MRAM that uses, as a storage layer, a perpendicular magnetization film having a magnetization easy axis in a direction perpendicular to a film plane is advantageous to write current reduction and higher capacity. A magnetoresistive element having a ferromagnetic tunnel junction used in this MRAM has been attracting attention since the discovery of a high magnetoresistance ratio shown by this magnetoresistive element. The magnetoresistive element comprises a storage layer variable in magnetization direction, a reference layer that maintains a predetermined magnetization direction, and a nonmagnetic layer disposed between the storage layer and the reference layer.

A material which constitutes the conventional storage layer and which has perpendicular magnetic anisotropy is an alloy or stack of a magnetic material, Co, Fe and Ni which are magnetic materials, Pt, Pd or the like, and Tb, Dy or the like. However, Pt, Pd, Tb, Dy and the like increase the friction factor of the magnetic material, and, in a heat treatment process, diffuse in the vicinity of MgO and change its electric characteristics, and further decrease the degree of magnetic anisotropy. Thus, there have heretofore been no available materials that allow for both current reduction by the decrease of the friction factor and the process heat resistance of electric and magnetic characteristics. For example, a CoPd alloy is high in perpendicular magnetic anisotropy, but has a disadvantage of being also high in friction factor and being nonresistant to a process heat (thermal disturbance) of about 350° C.

BRIEF DESCRIPTION OF THE DRAWINGS

FIGS. 5A and 5B are diagrams showing magnetic characteristics when the storage layer is a stack of CoFeB and Ta or W;

FIGS. 6A and 6B are diagrams showing magnetic characteristics when the storage layer is a stack of CoFeB and Ta or W;

FIGS. 7A and 7B are diagrams showing magnetic characteristics when the storage layer is made of CoFeB;

DETAILED DESCRIPTION

Figure 1:
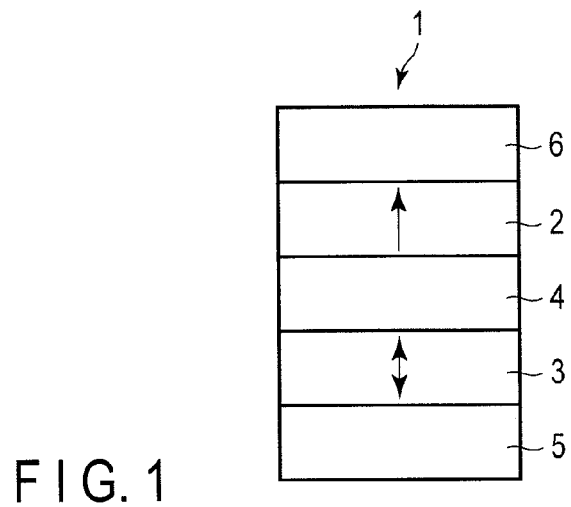
FIG. 1 is a sectional view showing essential parts of a magnetoresistive element according to a first embodiment.

Embodiments are described hereinafter with reference to the drawings. Throughout the following explanation, components having the same function and configuration are provided with the same signs, and are repeatedly explained only when necessary.

In general, according to one embodiment, a magnetoresistive element includes an electrode layer, a first magnetic layer, a second magnetic layer and a first nonmagnetic layer. The electrode layer includes a metal layer including at least one of Mo, Nb, and W. The first magnetic layer is disposed on the metal layer to be in contact with the metal layer and has a magnetization easy axis in a direction perpendicular to a film plane and is variable in magnetization direction. The second magnetic layer is disposed on the first magnetic layer and has a magnetization easy axis in the direction perpendicular to the film plane and is invariable in magnetization direction. The first nonmagnetic layer is provided between the first magnetic layer and the second magnetic layer. The magnetization direction of the first magnetic layer is varied by a current that runs through the first magnetic layer, the first nonmagnetic layer, and the second magnetic layer.

(First Embodiment)

A magnetoresistive element according to a first embodiment is described.

The magnetoresistive element referred to in the present specification and claims means a tunneling magnetoresistive effect (TMR) element (or a magnetic tunnel junction [MTJ] element) that uses a semiconductor or an insulator for a spacer layer. Although essential parts of the magnetoresistive element are shown in the drawings explained below, additional layers may be included as long as the configuration shown in the drawings are included.

(1) Structure of the Magnetoresistive Element

FIG. 1 shows essential parts of a magnetoresistive element according to a first embodiment.

A magnetoresistive element 1 performs writing by a spin-transfer torque magnetization reversal method. That is, the magnetoresistive element 1 changes the relative angle between the magnetizations of a storage layer and a reference layer into a parallel or antiparallel state (i.e., minimum or maximum resistance) in accordance with the direction of a spin-polarized current which is passed through each layer in a direction perpendicular to a film plane. The magnetoresistive element 1 thus associates the state with binary 0 or 1 and thereby stores the value.

As shown in FIG. 1, the magnetoresistive element 1 comprises at least two magnetic layers 2 and 3, and a nonmagnetic layer 4 provided between the magnetic layers 2 and 3. The magnetoresistive element 1 further comprises a foundation layer 5 provided as the foundation of the magnetic layer 3, and a cap layer 6 on the magnetic layer 2. In FIG. 1, arrows indicate magnetization directions.

The magnetic layer 3 has a magnetization easy axis in the direction perpendicular to the film plane, and rotates along the plane in which the magnetization easy axis intersects with the film plane. Hereinafter, the magnetic layer 3 is referred to as a storage layer (free layer, magnetization free layer, magnetization variable layer, recording layer). The storage layer 3 has a structure in which a first ferromagnetic material and a second ferromagnetic material are stacked, or a structure in which a nonmagnetic interlayer intervenes between a first ferromagnetic material and a second ferromagnetic material. Alternatively, the storage layer 3 may have a structure comprising the nonmagnetic interlayer and the second ferromagnetic material without the layer made of the first ferromagnetic material. This structure is preferable from the perspective of the throughput of an MTJ film forming process. Detailed properties of the storage layer 3 will be described later. The magnetization in the direction perpendicular to the film plane is hereinafter referred to as perpendicular magnetization.

The magnetic layer 2 has a magnetization easy axis in the direction perpendicular to the film plane, and its magnetization direction is fixed in contrast to the storage layer 3. Hereinafter, the magnetic layer 2 is referred to as a reference layer (magnetization reference layer, fixed layer, magnetization fixed layer, pinned layer). The reference layer 2 has a structure in which at least a third ferromagnetic material and a fourth ferromagnetic material are stacked. The magnetization of the reference layer 2 is directed opposite to the foundation layer 5 (upward) by way of example in FIG. 1, but may be directed toward the foundation layer 5 (downward).

The nonmagnetic interlayer (tunnel barrier layer) 4 is made of an insulating film of, for example, an oxide. Detailed properties of the nonmagnetic interlayer 4 will be described later.

The magnetoresistive element 1 is used for spin-transfer torque writing method. That is, in writing, a current is passed from the reference layer 2 to the storage layer 3 or from the storage layer 3 to the reference layer 2 in the direction perpendicular to the film plane such that electrons in which spin information is stored are injected from the reference layer 2 to the storage layer 3.

The spin angular momentum of the injected electrons is moved to the electrons in the storage layer 3 in accordance with the conservation law of the spin angular momentum such that the magnetization of the storage layer 3 is inverted. That is, the magnetization direction of the storage layer 3 changes with a bi-directional current running through the storage layer 3, the nonmagnetic interlayer 4, and the reference layer 2.

The magnetoresistive element shown in FIG. 1 shows a so-called top-pin structure in which the storage layer 3 is formed on the foundation layer 5, and the reference layer 2 is formed on the nonmagnetic interlayer 4. The storage layer 3 may be disposed on the foundation layer 5 in contact with the foundation layer 5.

As previously described, the foundation layer 5 may be further formed under the storage layer 3. The foundation layer 5 is used to control the crystallinity of the layers above the storage layer 3, such as crystalline orientation and crystal grain diameters. The foundation layer 5 may serve as an electrode layer, or an electrode layer may be further provided under this electrode layer (foundation layer 5) to constitute an electrode layer having a stack structure. Alternatively, the foundation layer 5 may be an electrode layer comprising a metal layer, or an electrode layer having a stack structure in which a nonmetal conductive layer is stacked on a metal layer. The foundation layer 5 may be a metal layer which includes at least one of, for example, Mo, Nb, and W. Moreover, the foundation layer 5 may be a metal layer which includes at least one of, for example, Mo, Nb, W, Ta, and Ir.

The cap layer 6 may be further formed on the reference layer 2. The cap layer 6 mainly functions as a protective layer to, for example, prevent the oxidation of the magnetic layers.

As previously described, the storage layer 3 has the structure in which the first ferromagnetic material and the second ferromagnetic material are stacked, or the structure in which the interlayer including a nonmagnetic element intervenes between the first ferromagnetic material and the second ferromagnetic material, or the structure in which the interlayer including a nonmagnetic element and the second ferromagnetic material are stacked. The second ferromagnetic material is disposed between the first ferromagnetic material and the nonmagnetic interlayer 4. The perpendicular magnetic anisotropy of the first ferromagnetic material that constitutes the storage layer 3 is preferably greater than the perpendicular magnetic anisotropy of the second ferromagnetic material.

The first ferromagnetic material is, for example, a single Co layer, or an alloy including Co as the main component. The first ferromagnetic material is preferentially oriented in the atom-dense surface of Co or the alloy.

The second ferromagnetic material is, for example, a CoFe alloy, or an alloy $(Co_{100-x}—Fe_x)_{100-y}—B_y$ that includes Co, Fe, and B, wherein $x \geq 20$ at %, and $0 \leq y \leq 30$ at %. The second ferromagnetic material may be an alloy which includes Co and Fe and which further includes at least one of Ta, Si, Nb, V, W, Cr, Mo, and B. The second ferromagnetic material may be in the form of a stack of these substances, such as CoFeB/CoFeTa, or CoFeB/Ta/CoFeB.

The second ferromagnetic material may have a cubic structure or a tetragonal structure and include crystal grains oriented in a (100) face.

For the third ferromagnetic material that constitutes the reference layer 2, it is preferable to select a material that does not easily change in magnetization direction in contrast to the storage layer 3.

Now, a magnetoresistive element according to a modification of the first embodiment is described.

Figure 2:
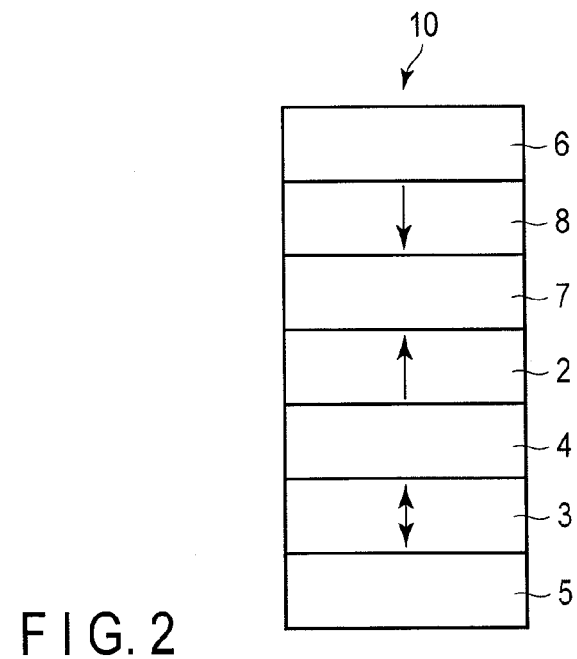
FIG. 2 is a sectional view showing essential parts of a magnetoresistive element according to a modification of the first embodiment.

FIG. 2 shows a modification of the magnetoresistive element shown in FIG. 1.

The difference between the structure of a magnetoresistive element 10 shown in FIG. 2 and the structure shown in FIG. 1 is that a nonmagnetic layer 7 and a bias layer (shift adjustment layer) 8 are inserted between a reference layer 2 and a cap layer 6. That is, the nonmagnetic layer 7 and the bias layer 8 are formed on the reference layer 2 in order, and the cap layer 6 is formed on the bias layer 8.

The bias layer 8 is a perpendicular magnetization film made of a ferromagnetic body and having a magnetization easy axis in a direction perpendicular to a film plane. The magnetization of the bias layer 8 is fixed to a direction opposite to the magnetization direction of the reference layer 2. The bias layer 8 has the effect of adjusting, to an opposite direction, an offset of the inversion characteristic of a storage layer caused by a leakage magnetic field from the reference layer 2. Detailed properties of the nonmagnetic layer 7 and the bias layer 8 will be described later.

(2) Storage Layer

When the perpendicular magnetization film is used as the storage layer 3 of the magnetoresistive element 1, the use of a material that shows a high perpendicular magnetic anisotropy allows thermal disturbance resistance to be maintained and also allows both miniaturization and current reduction. A specific example of the selection of a material to be provided as the storage layer is described below in detail.

(2-1) Storage Layer Material

In order to obtain a perpendicular magnetization film that satisfies both sufficient thermal disturbance resistance and low-current magnetization inversion, it is preferable to decrease a magnetic relaxation coefficient α and increase a spin transfer efficiency coefficient η while maintaining a thermal disturbance index (Δ).

As the spin transfer efficiency coefficient η monotonously increases with spin polarization, a material that shows a high spin polarization is preferable. The magnetic relaxation coefficient α can be reduced by a stack film comprising a magnetic layer having a low magnetic relaxation coefficient α and a perpendicular magnetization film having a high magnetic relaxation coefficient.

The magnetic layer having a low magnetic relaxation coefficient α is made of a material having a perpendicular magnetic anisotropy lower than the perpendicular magnetic anisotropy of the perpendicular magnetization film having a high magnetic relaxation coefficient. However, in this case, the thickness of the magnetic layer having a low magnetic relaxation coefficient α is smaller than the thickness of the perpendicular magnetization film, and the reduction degree of an inversion current is insufficient. Therefore, when a future capacity increase is taken into consideration, further current reduction is needed.

In the present embodiment, the storage layer 3 is made of the first and second ferromagnetic materials. The perpendicular magnetization film as the first ferromagnetic material has a sufficiently high perpendicular magnetic anisotropy coefficient Ku even in its area having an extremely small thickness of 1 nm or less. Therefore, the second ferromagnetic material becomes the perpendicular magnetization film as a result of magnetic exchange coupling of the first and second ferromagnetic materials even if the perpendicular magnetic anisotropy of the second ferromagnetic material is lower than the perpendicular magnetic anisotropy of the first ferromagnetic material and the thickness of the second ferromagnetic material is smaller than the thickness of the first ferromagnetic material.

Consequently, the features of the second ferromagnetic material can be reflected in the storage layer 3. For example, the second ferromagnetic material can be a material having a low magnetic relaxation coefficient α, compatible with the material (e.g., an oxide having an NaCl structure) that constitutes the nonmagnetic interlayer 4, having a high polarization, and developing a high spin transfer efficiency coefficient η. A specific example of the second ferromagnetic material will be described in detail later.

A specific explanation is given below.

(2-1-1) Example of the First Ferromagnetic Material that Constitutes the Storage Layer A comparative example is described. In the comparative example, the first ferromagnetic material that constitutes the storage layer 3 is made of cobalt (Co) an alloy including or Co as the main component. In this case, in order to form this alloy into a perpendicular magnetization film, the alloy has only to be densely distributed within the surface of the film, that is, grown in an fcc (111) orientation or in an hcp (0001) direction.

More specifically, crystal orientation/growth can be controlled by properly selecting the foundation layer 5 shown in FIG. 1 and FIG. 2. Details and a specific production method of the foundation layer 5 will be described later.

Figure 3:
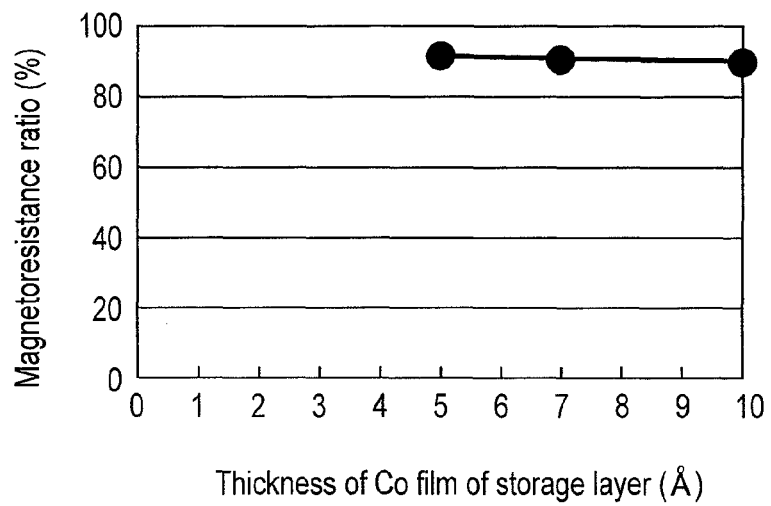
FIG. 3 is a graph showing the dependence of the magnetoresistance ratio of a magnetoresistive element that uses a Co film as a storage layer on the Co film thickness.

FIG. 3 shows a measurement result of a magnetoresistance ratio when the MTJ having the configuration shown in FIG. 1 is formed by using a perpendicular magnetization film for the reference layer, using Co as the first ferromagnetic material of the storage layer, and using a CoFeB alloy for the second ferromagnetic material. The horizontal axis represents the thickness of the first ferromagnetic material Co, and the vertical axis represents the magnetoresistance ratio. The magnetization of the storage layer is perpendicular to the film plane. A high MR ratio is maintained in a range in which the thickness of Co is 10 angstroms or less.

Figure 4:
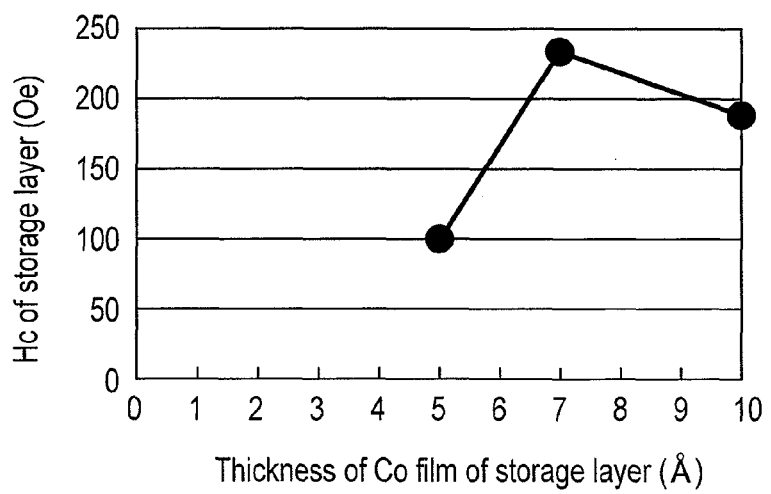
FIG. 4 is a graph showing the dependence of the coercive force of the magnetoresistive element that uses the Co film as a storage layer on the Co film thickness.

FIG. 4 shows the measurement result of the coercive force Hc of the storage layer of the MTJ film when the same sample as that in FIG. 3 is used. The coercive force reaches its peak when the thickness of Co is 7 angstroms. When the thickness of Co is more than 10 angstroms, the magnetization of the storage layer is level with the film plane, so that TMR characteristics of the perpendicular magnetization film are not obtained. Thus, the thickness of Co is preferably 10 angstroms or less. The first ferromagnetic material may be an alloy including Co as the main component.

(2-1-2) Example of the Second Ferromagnetic Material that Constitutes the Storage Layer The second ferromagnetic material that constitutes the storage layer 3 of the magnetoresistive element 1 is one of the elements Co, Fe, and Ni, or an alloy that contains at least one or more elements. For example, the magnetic relaxation coefficient α of a ternary alloy Co—Fe—Ni is particularly low in Co—Fe and in Ni—Fe. Thus, Co, Fe, and Ni are suitable to the second ferromagnetic material.

The second ferromagnetic material preferably functions to reduce a lattice mismatch between the second ferromagnetic material and the nonmagnetic interlayer 4 in a highly polarized material.

That is, when an oxide having an NaCl structure is used for the nonmagnetic interlayer 4, the oxide having the NaCl structure is easily grown using a (100) face as a preferential orientation face if crystals are grown (i) on, for example, an amorphous CoFeNiB alloy including one or more of Fe, Co, and Ni or (ii) on an alloy which has a (100) preferential orientation face in a body-centered cubic (BCC) structure and which includes one or more of Fe, Co, and Ni.

The (100) face of the oxide having the NaCl structure can be extremely easily preferentially orientated particularly on a CoFe—X (X is at least one of B, C, and N) amorphous alloy to which, for example, B, C, or N is added. CoFe—B has a low magnetic relaxation coefficient and is suited to the second ferromagnetic material.

(2-1-3) Example of the Stack Structure of the Second Ferromagnetic Material

In this example, the storage layer 3 of the magnetoresistive element 1 is a stack of $Co_{40}Fe_{40}B_{20}$ as the second ferromagnetic material and Ta or W as the nonmagnetic interlayer. The storage layer 3 is in contact with the foundation layer 5.

FIGS. 5A, 5B, 6A, and 6B show magnetic characteristics when the storage layer 3 is only produced by a stack of $Co_{40}Fe_{40}B_{20}$ as the second ferromagnetic material and Ta or W as the nonmagnetic interlayer and when the material of the foundation layer 5 is used as a parameter. Here, the first ferromagnetic material is not formed.

The horizontal axis represents an applied magnetic field, and the vertical axis represents a magnetization amount. It is found out from FIGS. 5A, 5B, 6A, and 6B that when the material of the foundation layer 5 is Ir, Ta, or W, a stack film of $Co_{40}Fe_{40}B_{20}$ and Ta or W has perpendicular magnetization characteristics. That is, it is apparent from FIGS. 5A, 5B, 6A, and 6B that the perpendicular magnetic anisotropy of the second ferromagnetic material alone ensures the perpendicular magnetic anisotropy of the storage layer 3 (ensures that the direction perpendicular to the film plane serves as a magnetization easy axis).

FIGS. 7A, 7B, 8A, and 8B show magnetic characteristics when the storage layer 3 is made of $Co_{40}Fe_{40}B_{20}$ as the second ferromagnetic material, when the material of the foundation layer 5 is Ta, and when the thickness of Ta is used as a parameter. Here, the first ferromagnetic material is not formed.

It is found out from FIGS. 7A, 7B, 8A, and 8B that the magnetization amount (Ms×t) of the entire film is small when Ta of the foundation layer 5 has a great thickness of 10 angstroms or more, and that the magnetization amount is increased when Ta has a small thickness of 3 angstroms. That is, FIGS. 7A, 7B, 8A, and 8B show that Ta of the foundation is diffused into and mixed with $Co_{40}Fe_{40}B_{20}$ of the second ferromagnetic material, thereby reducing the magnetization amount of the second ferromagnetic material.

Figure 8A:
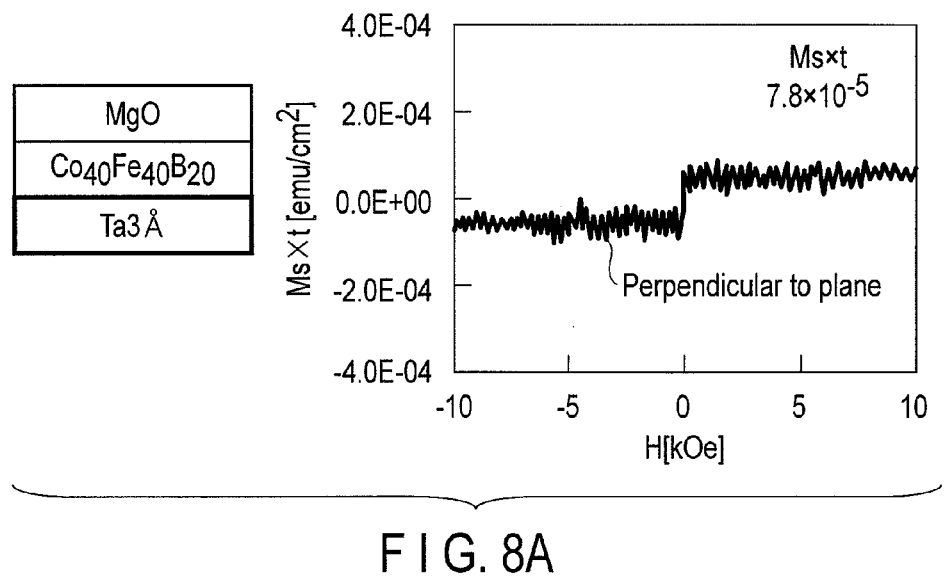
FIGS. 8A and 8B are diagrams showing magnetic characteristics when the storage layer is made of CoFeB.
Figure 8B:
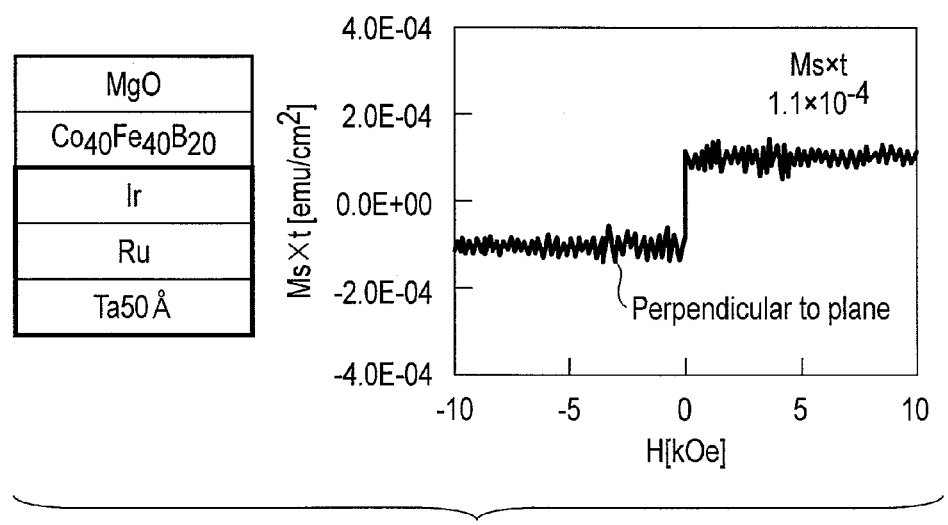

FIG. 8B shows magnetic characteristics when Ir is used for the material of the foundation layer 5 for $Co_{40}Fe_{40}B_{20}$ as the second ferromagnetic material. It is found out that the magnetization amount of the entire film is greater than when the material of the foundation layer 5 is Ta. This may be attributed to the fact that the combination of $Co_{40}Fe_{40}B_{20}$ of the second ferromagnetic material and Ir of the foundation layer 5 inhibits the diffusion of Ir into $Co_{40}Fe_{40}B_{20}$ as compared with the case where the foundation layer 5 is made of Ta.

It is apparent from FIGS. 7A, 7B, 8A, and 8B that in order to use the perpendicular magnetic anisotropy of the second ferromagnetic material alone to constitute the storage layer 3, the material and thickness have to be controlled to inhibit the diffusion of the foundation layer. For example, Mo or Nb which does not easily cause diffusion and which does not increase the magnetic relaxation coefficient $\alpha$ can also be a candidate for the material of the foundation layer for $Co_{40}Fe_{40}B_{20}$ as the second ferromagnetic material.

(3) Nonmagnetic Layer

An oxide having an NaCl structure is preferable as the material of the nonmagnetic interlayer 4 of the magnetoresistive element. More specifically, such materials include, for example, MgO, CaO, SrO, TiO, VO, and NbO.

When the magnetization direction of the storage layer 3 is antiparallel to the magnetization direction of the reference layer 2, a spin-polarized Δ1 band is responsible for tunnel conduction, so that majority spin electrons alone contribute to conduction. As a result, the magnetoresistive element 1 decreases in conductivity and increases in resistance.

Conversely, when the magnetization direction of the storage layer 3 is parallel to the magnetization direction of the reference layer 2, a Δ5 band which is not spin-polarized dominates conduction, so that the magnetoresistive element 1 increases in conductivity and decreases in resistance. Therefore, the formation of the Δ1 band becomes a point of the development of a high TMR.

In order to form the Δ1 band, the interfaces between the (100) face of the nonmagnetic interlayer 4 made of the oxide having the NaCl structure and the storage layer 3 as well as the reference layer 2 have to be consistent. From the perspective of the formation of the Δ1 band, it is preferable to select a material that shows a lattice mismatch of 5% or less in the (100) face of the nonmagnetic interlayer 4.

(4) Bias Layer

As shown in FIG. 2, the nonmagnetic layer 7 and the bias layer (shift adjustment layer) 8 may be disposed between the reference layer 2 and the cap layer 6 of the magnetoresistive element 1. As a result, the shift of the inversion current of the storage layer 3 caused by a leakage magnetic field from the reference layer 2 can be reduced and adjusted (the shift can be canceled).

The nonmagnetic layer 7 preferably has thermal resistance that prevents the reference layer 2 and the bias layer 8 from being mixed by a thermal process and has a function to control the crystal orientation during the formation of the bias layer 8.

Moreover, when the thickness of the nonmagnetic layer 7 is larger, the distance between the bias layer 8 and the storage layer 3 is greater, so that a shift adjustment magnetic field applied to the storage layer 3 from the bias layer 8 is reduced. Thus, the thickness of the nonmagnetic layer 7 is preferably 5 nm or less.

The bias layer 8 is made of a ferromagnetic material having magnetization easy axis in the direction perpendicular to the film plane. More specifically, an ordered alloy material, an artificial lattice material, or a disordered alloy material can be used.

The ordered alloy material is as follows:

An ordered alloy comprising one or more of the elements Fe, Co, and Ni and one or more of the elements Pt ad Pd and having an $L1_0$ type crystal structure. Such ordered alloys include, for example, $Fe_{50}Pt_{50}$, $Fe_{50}Pd_{50}$, $Co_{50}Pt_{50}$, $Fe_{30}Ni_{20}Pt_{50}$, $Co_{30}Fe_{20}Pt_{50}$, and $Co_{30}Ni_{20}Pt_{50}$. These ordered alloys are not limited to the above composition ratios.

An impurity element such as copper (Cu), chromium (Cr), or silver (Ag), or an alloy of these impurity elements or an insulator can be added to the above-mentioned ordered alloys to adjust the effective magnetic anisotropy energy and saturation magnetization.

The artificial lattice material is as follows:

A structure having an alternating stack of an alloy which includes one or more of the elements Fe, Co, and Ni and an alloy which includes one or more of the elements Cr, Pt, Pd, Ir, Rh, Ru, Os, Re, Au, and Cu. Such artificial lattices include, for example, Co/Pt artificial lattice, Co/Pd artificial lattice, CoCr/Pt artificial lattice, Co/Ru artificial lattice, and Co/Os, Co/Au, Ni/Cu artificial lattice.

These artificial lattices can adjust effective magnetic anisotropy energy and saturation magnetization by adding an element to the magnetic layer and adjusting the thickness ratio and stacking cycle of the magnetic layer and the nonmagnetic layer.

The disordered alloy material is as follows:

A metal which includes cobalt (Co) as the main component and which includes one or more of the elements chromium (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni).

Such a disordered alloy includes, for example, a CoCr alloy, a CoPt alloy, a CoCrPt alloy, a CoCrPtTa alloy, and a CoCrNb alloy. These alloys can increase the ratio of nonmagnetic elements to adjust effective magnetic anisotropy energy and saturation magnetization.

However, the bias layer 8 is distant from the storage layer 3 as compared with the reference layer 2. Therefore, in order for the leakage magnetic field applied to the storage layer 3 to be adjusted by the bias layer 8, it is necessary to set the thickness of the bias layer 8 or the intensity of its saturation magnetization Ms to be greater than that of the reference layer 2.

That is, the following relational expression has to be satisfied:

$$M_{S2} \times t_2 < M_{S8} \times t_8 \quad \text{(Expression 1)}$$

wherein $t_2$ and $M_{S2}$ are the thickness and saturation magnetization of the reference layer 2, and $t_8$ and $M_{S8}$ are the thickness and saturation magnetization of the bias layer 8.

For example, suppose that an element having a size of 50 nm is to be processed. In this case, in order to offset the shift of the inversion current, the following characteristics are required if a magnetic material having a saturation magnetization Ms2 of 1000 emu/cc and a thickness t2 of 5 nm is used for the reference layer 2: a thickness of 3 nm for the nonmagnetic layer 7, and a saturation magnetization Ms8 of 1000 emu/cc and a thickness t8 of 15 nm for the bias layer 8.

In order to obtain the above-mentioned shift cancellation effect that reduces and adjusts the shift of the inversion current of the storage layer 3 caused by a leakage magnetic field from the reference layer 2, the magnetization direction of the reference layer 2 and the magnetization direction of the bias layer 8 should be set to be antiparallel to each other.

To satisfy this relation, such a material can be selected as to allow the relation between the coercive force Hc2 of the reference layer 2 and the coercive force Hc8 of the bias layer 8 to satisfy Hc2>Hc8 or Hc2<Hc8. In this case, the magnetization direction of the reference layer 2 and the magnetization direction of the bias layer 8 can be set to be antiparallel to each other by using minor loop magnetization to previously invert the magnetization direction of the layer having low coercive force.

The magnetization direction of the reference layer 2 and the magnetization direction of the bias layer 8 can also be set to be antiparallel to each other by synthetic anti-ferromagnet coupling of the reference layer 2 and the bias layer 8 via the nonmagnetic layer 7.

More specifically, for example, ruthenium (Ru) can be used as the material of the nonmagnetic layer 7 to couple together the reference layer 2 and the bias layer 8 so that their magnetization directions are antiparallel to each other. In this case, the reference layer 2 can be made of, for example, a CoFe alloy or an alloy $(Co_{100-x}-Fe_x)_{100-y}-B_y$ that includes Co, Fe, and B, wherein x≥20 at %, and 0≤y≤30 at %.

Thus, the magnetic field leaking from the reference layer 2 can be reduced by the bias layer 8, so that the shift of the inversion current of the storage layer 3 can be reduced. In order to hold down the increase of a write current for spin transfer and ensure thermal disturbance resistance, the shift magnetic field of the storage layer needs to be sufficiently lower than the coercive force (Hc) of the storage layer.

As described above, according to the first embodiment, it is possible to obtain a magnetoresistive element having high thermal disturbance resistance and capable of writing by spin-transfer magnetization reversal using a reduced current.

Although the storage layer is disposed on the lower side and the reference layer is disposed on the upper side in the magnetoresistive element according to the embodiment described above, the storage layer may be disposed on the upper side and the reference layer may be disposed on the lower side. That is, the storage layer and the reference layer may be inverted.

(Second Embodiment)

Now, a magnetic random access memory according to a second embodiment is described.

In the second embodiment, a magnetic random access memory (MRAM) that uses the magnetoresistive element according to the first embodiment is described. Here, a spin-transfer torque writing type MRAM that uses the magnetoresistive element 1 (or 10) is described.

(1) Structure of the Magnetic Random Access Memory

Figure 9:
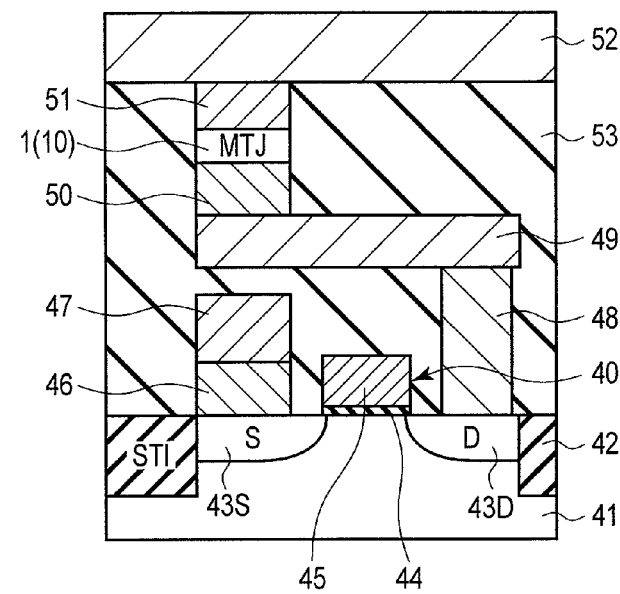
FIG. 9 is a sectional view showing the structure of a memory cell in an MRAM according to a second embodiment.

FIG. 9 is a sectional view showing the structure of a memory cell in the MRAM according to the second embodiment.

As shown, the memory cell comprises the magnetoresistive element (MTJ element) 1 (or 10) and a select transistor 40. An element isolation insulating layer 42 is provided in the surface area of a p-type semiconductor substrate 41. The surface area of the semiconductor substrate 41 where the element isolation insulating layer 42 is not provided serves as an element area (active area) where elements are formed. The element isolation insulating layer 42 is produced by, for example, shallow trench isolation (STI). For example, silicon oxide is used for the STI.

A source area 43S and a drain area 43D that are separate from each other are formed in the element area of the semiconductor substrate 41. The source area 43S and the drain area 43D are each produced from an n+-type diffusion area which is formed by introducing a high-concentration impurity such as an n+-type impurity into the semiconductor substrate 41.

A gate insulating film 44 is formed on the semiconductor substrate 41 between the source area 43S and the drain area 43D. A gate electrode 45 is formed on the gate insulating film 44. The gate electrode 45 functions as a word line WL. Thus, the semiconductor substrate 41 is provided with the select transistor 40.

A wiring layer 47 is formed on the source area 43S via a contact 46. The wiring layer 47 functions as a bit line /BL. An extension line 49 is formed on the drain area 43D via a contact 48.

The magnetoresistive element 1 (or 10) intervening between a lower electrode 50 and an upper electrode 51 is provided above the extension line 49. A wiring layer 52 is formed on the upper electrode 51. The wiring layer 52 functions as a bit line BL. The space between the semiconductor substrate 41 and the wiring layer 52 is filled with an interlayer insulating film 53 made of, for example, silicon oxide.

(2) Circuit Configuration and Operation of the Magnetic Random Access Memory

Now, the circuit configuration and operation of the MRAM according to the second embodiment are described.

Figure 10:
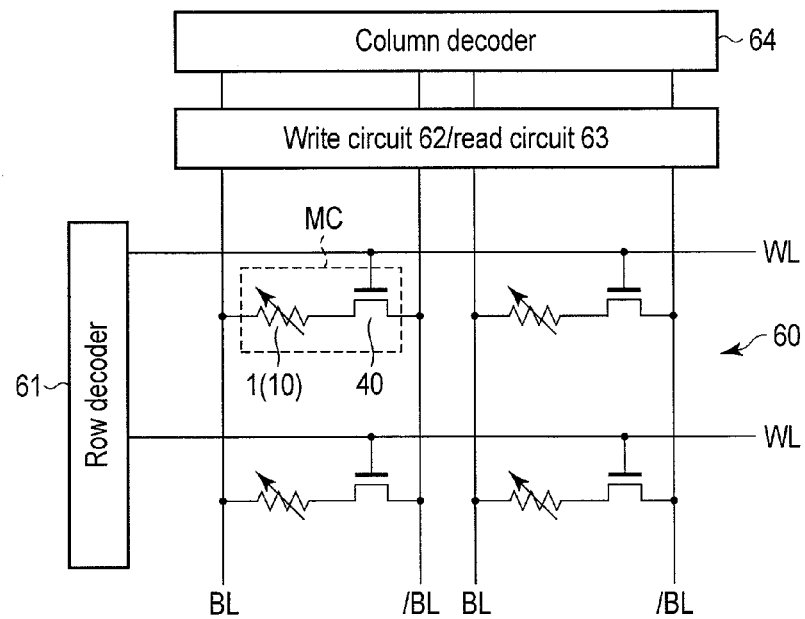
FIG. 10 is a circuit diagram showing the configuration of the MRAM according to the second embodiment.

FIG. 10 is a circuit diagram showing the configuration of the MRAM according to the second embodiment.

The MRAM comprises a memory cell array 60 having memory cells MC arranged in matrix form. Bit-line pairs BL, /BL are provided in the memory cell array 60 to extend in a column direction. Word lines WL are also provided in the memory cell array 60 to extend in a row direction.

The memory cell MC is disposed at the intersection of bit line BL and the word line WL. Each of the memory cells MC comprises the magnetoresistive element 1 and the select transistor (e.g., an n-channel MOS transistor) 40. One end of the magnetoresistive element 1 is connected to bit line BL. The other end of the magnetoresistive element 1 is connected to the drain of the select transistor 40. The source of the select transistor 40 is connected to bit line /BL. The gate of the select transistor 40 is connected to the word line WL.

A row decoder 61 is connected to the word lines WL. A write circuit 62 and a read circuit 63 as current supply circuits are connected to the bit-line pairs BL, /BL. A column decoder 64 is connected to the write circuit 62 and the read circuit 63. Each of the memory cells MC is selected by the row decoder 61 and the column decoder 64.

Data is written to the memory cell MC as below. First, in order to select a memory cell MC to write to, the word line WL connected to this memory cell MC is activated. As a result, the select transistor 40 is turned on.

Here, a bi-directional write current Iw is supplied to the magnetoresistive element 1 in accordance with the data to be written. More specifically, when the write current Iw is supplied to the magnetoresistive element 1 from bit line BL to bit line /BL, the write circuit 62 applies a positive voltage to bit line BL, and applies a ground voltage to bit line /BL. When the write current Iw is supplied to the magnetoresistive element 1 from bit line /BL to bit line BL, the write circuit 62 applies a positive voltage to bit line /BL, and applies a ground voltage to bit line BL. Thus, binary 0 or binary 1 can be written to the memory cell MC.

Now, data is read from the memory cell MC as below. First, the select transistor 40 of a memory cell MC to be selected is turned on. The read circuit 63 supplies a read current Ir to the magnetoresistive element 1, for example, from bit line /BL to bit line BL. The read circuit 63 then detects the resistance of the magnetoresistive element 1 on the basis of the read current Ir. Consequently, the data stored in the magnetoresistive element 1 can be read in accordance with the resistance of the magnetoresistive element 1.

Thus, according to the second embodiment, the magnetic random access memory can be configured by using the magnetoresistive element.

As described above, according to the embodiments, it is possible to provide a magnetoresistive element which has high thermal disturbance resistance that prevents magnetic characteristics and output characteristics from deteriorating even after a high-temperature heat treatment process and which is capable of writing by spin-transfer magnetization reversal using a reduced current, and also provide a magnetic random access memory that uses this magnetoresistive element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
    an electrode layer which comprises a metal layer including at least one of Mo, Nb, and W;
    a first magnetic layer which is disposed on the metal layer to be in contact with the metal layer and which has a magnetization easy axis in a direction perpendicular to a film plane and which is variable in magnetization direction;
    a second magnetic layer which is disposed on the first magnetic layer and which has a magnetization easy axis in the direction perpendicular to the film plane and which is invariable in magnetization direction; and
    a first nonmagnetic layer provided between the first magnetic layer and the second magnetic layer,
    wherein the magnetization direction of the first magnetic layer is varied by a current that runs through the first magnetic layer, the first nonmagnetic layer, and the second magnetic layer.

2. The magnetoresistive element according to claim 1,
    wherein the first magnetic layer comprises a CoFe alloy, or an alloy $(Co_{100-x}-Fe_x)_{100-y}-B_y$ that includes Co, Fe, and B, where $x \geq 20$ at %, and $0 \leq y \leq 30$ at %.

3. The magnetoresistive element according to claim 2,
    wherein the first magnetic layer comprises one of a cubic structure and a tetragonal structure, and is oriented in a (100) face.

4. The magnetoresistive element according to claim 1, further comprising:
    a third magnetic layer which reduces or adjusts a leakage magnetic field from the second magnetic layer, the third magnetic layer comprising a magnetization easy axis in the direction perpendicular to the film plane; and
    a second nonmagnetic layer disposed between the second magnetic layer and the third magnetic layer.

5. A magnetic random access memory according to claim 1, comprising a memory cell which comprises the magnetoresistive element.

6. The magnetic random access memory according to claim 5, further comprising an upper electrode and a lower electrode which sandwich the memory cell.

7. The magnetic random access memory according to claim 5, further comprising:
    a write circuit which bi-directionally supplies a current to the magnetoresistive element.

8. The magnetic random access memory according to claim 7,
    wherein the memory cell comprises a select transistor electrically connected between the magnetoresistive element and the write circuit.

9. The magnetic random access memory according to claim 5,
    wherein the memory cell comprises a select transistor electrically connected the magnetoresistive element.

* * * * *